United States Patent [19]

Jones et al.

[11] 4,155,082
[45] May 15, 1979

[54] ELECTRICAL CONNECTORS INCLUDING POWER FAILURE WARNING MEANS

[75] Inventors: Ian C. Jones, 29 Lavender Road, Kempshott Hill, Basingstoke, Hampshire; Leonard G. McDowell, 1 Zinnia Close, Basingstoke, Hampshire; Norman A. Lessiter, Hedge End, near Southampton, all of England

[73] Assignee: Ian C. Jones and Leonard G. McDowell, England

[21] Appl. No.: 852,084

[22] Filed: Nov. 16, 1977

[30] Foreign Application Priority Data

Nov. 16, 1976 [GB] United Kingdom ................ 4775/76

[51] Int. Cl.² ............................................ G08B 21/00
[52] U.S. Cl. ..................................... 340/656; 340/663
[58] Field of Search ............... 340/248 B, 253 C, 654, 340/656, 662, 663, 664

[56] References Cited

U.S. PATENT DOCUMENTS

| | | | |
|---|---|---|---|
| 3,383,522 | 5/1968 | Appelbeck et al. | 340/248 B |
| 3,670,246 | 6/1972 | Gately | 340/248 B X |
| 3,801,974 | 4/1974 | Aitken | 340/248 B |
| 3,851,322 | 11/1974 | Compoly et al. | 340/248 B X |
| 3,976,986 | 8/1976 | Zabroski | 340/253 C |
| 4,001,803 | 1/1977 | Lombardo | 340/248 B |

*Primary Examiner*—John W. Caldwall, Sr.
*Assistant Examiner*—Daniel Myer
*Attorney, Agent, or Firm*—Lawrence E. Laubscher

[57] ABSTRACT

An audible warning device is integrated within an electrical connector in the form of a mains plug or mains adaptor to produce an audible warning in the absence of the mains supply. The plug or adaptor may incorporate further circuits for producing distinctive warnings should the power supply be subsequently reconnected, and also should the voltage of an internal battery powering the device drop below a predetermined value. In the case of an adaptor, the device has such internal connections that a warning will be produced if the power supply plug becomes disconnected from the adaptor, the adaptor from the power supply socket, or both.

12 Claims, 7 Drawing Figures

ELECTRICAL CONNECTORS INCLUDING POWER FAILURE WARNING MEANS

BRIEF DESCRIPTION OF THE PRIOR ART

This invention relates to connector devices, and more particularly to connector devices having arrangements for providing warning of failure of mains (or power) supply to an apparatus.

Today there is an increasing growth in equipment for the home, office, shop and industry which requires a continuous supply of mains electricity.

Such equipment includes, for example, deep freezers, refrigerators, medical apparatus and telexes.

For the convenience of quick, easy and low cost installation much of this equipment is connected to the mains supply by way of a conventional floating mains plug inserted in a fixed wall socket.

However, with such a connection the mains supply can easily be accidentally removed either by the withdrawal of the plug from the socket or by turning off the local switch on the socket without the user being aware of the undesirable or hazardous condition which has occured. It is an object of the invention to provide an arrangement which will give an audible warning when such an eventuality occurs.

SUMMARY OF THE INVENTION

The present invention provides an electrical connector device for connecting an apparatus to a mains supply, comprising connecting means arranged to be connected to the mains supply, means for detecting the absence of mains voltage on said connecting means, and indicating means arranged to be connected to a source of power and operative in response to said detecting means for indicating the absence of mains voltage.

There will be described hereinafter an arrangement integrated within the mains plug which provides an audible alarm in the absence of the mains supply in order to give warning of the undesirable condition. It will also provide such a warning if a fuse which may be incorporated in the plug blows.

An alternative embodiment will be described wherein in addition to the above mentioned function, the arrangement will provide an audible warning should the supply, having failed, be subsequently reconnected, such warning continuing after reconnection until a reset switch is activated to terminate the warning. In addition, an audible warning may be provided should the voltage of battery be provided to power the alarm and enclosed within the device drop below a predetermined value. The audible warning may consist of an intermittent periodic sound whose period varies depending on the cause of the warning or whose frequency is altered or both. The intermittence of the audible warning contributes to extending the life of the battery when the alarm is operating.

A further embodiment will be described wherein either of the above mentioned embodiments are enclosed within an adaptor rather than a plug, said adaptor fitting between a mains outlet socket and a conventional mains plug attached to some electrical appliance. In this case, the alarm will produce an audible warning should the appliance plug be disconnected from the adaptor, or the adaptor from the mains outlet socket, or under both of these conditions. This embodiment may be used under circumstances wherein commonly used mains plugs are too small to accomodate any additional components.

In order that the invention may be clearly understood and readily carried into effect, an embodiment thereof will now be described by way of example with reference to the accompanying drawings, in which.

Figure 1:
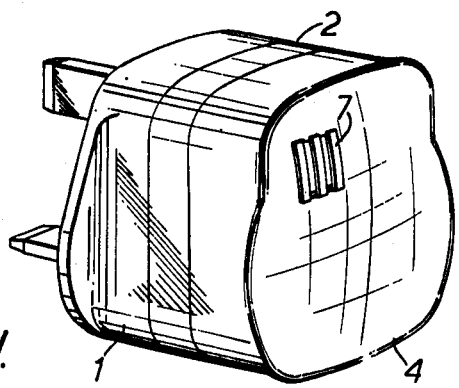
FIG. 1 shows a perspective view of an arrangement in accordance with one embodiment of the invention.
Figure 2:
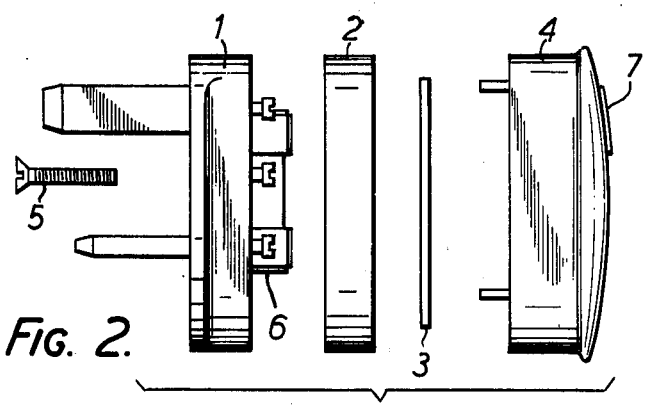
FIG. 2 shows an exploded view of the arrangement of FIG. 1.
Figure 4:
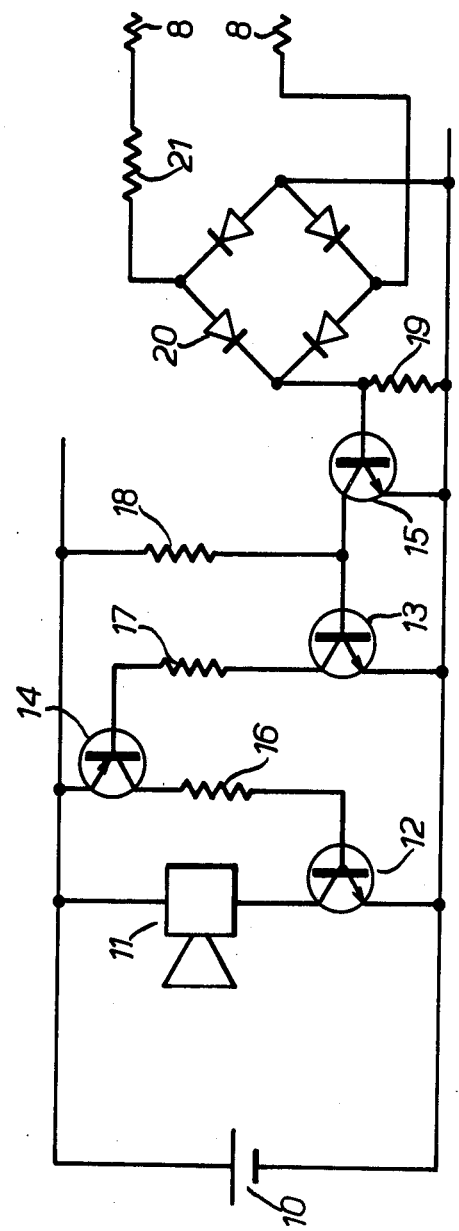
FIG. 4 shows a circuit diagram of the electronic portion of the arrangement.

Referring to FIGS. 1 and 2, the arrangement comprises a conventional 13A. 3-pin plug base 1 which forms the mechanical base to the arrangement. A middle moulding 2 is used to support a printed circuit board 3, containing electronic components as shown in FIG. 4. A further purpose of middle moulding 2 is to keep printed circuit board 3 in isolation from base 1. Finally an outer housing 4 is used to insulate the printed circuit board 3 and provide fixing against 2 the entire arrangement being fixed together by a screw 5 into the outer housing 4. The screws 6 provide conventional cable connection and clamp to plug base 1. Furthermore a pressure vent 7 (FIG. 1) is provided in outer housing 4 in order to allow the sound to be readily dissipated.

Figure 3:
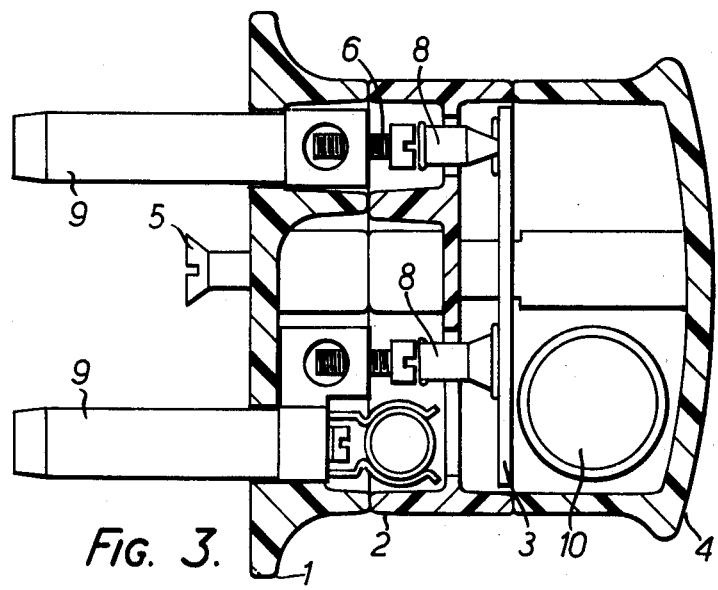
FIG. 3 shows a sectioned view of the arrangement with the major components attached.

Referring to FIG. 3, in order to provide simple connection of the electronic circuit FIG. 4 mounted on the printed circuit board 3 to the mains input applied at prongs 9, spring plates 8 are allowed to make contact through an aperture in moulding 2 with cable screws 6 which are carrying mains potential applied from prongs 9.

A battery 10 which provides power for the alarm when the mains supply fails can only be reached by removal of the arrangement from the mains supply and then by removal of screw 5 hence alleviating the danger of exposure to live parts.

Referring to FIG. 4 the mains supply is applied at springs 8 through a current limiting resistor 21 and a d-c output is obtained from a bridge rectifier 20. The output of rectifier 20 is applied across a resistor 19 to the base of a transistor 15. In this condition only transistor 15 is turned on and this causes current to flow from the battery 10 through a resistor 18. The value of resistor 18 is high in order that extremely low currents of the order of μA are taken from battery 10. Battery 10 can be of the alkaline type and under this condition providing the circuit is not used a life approaching that of shelf life can be realized. However, the battery could alternatively be a nickel-cadmium rechargeable battery provided that small trickle charge is supplied from rectifier bridge 20 via a ballast resistor (not shown). If no voltage appears across springs 8 due to absence of mains supply, transistor 15 is turned off and current through resistor 18 turns on a transistor 13, and hence a transistor 14 and a transistor 12, via respective resistors 17 and 16. When transistor 12 is turned on, an electronic alarm of known type 11 is activated from the power available from battery 10 and an audible alarm is given which continues for a duration dependent on the capacity of battery 10.

Figure 5:
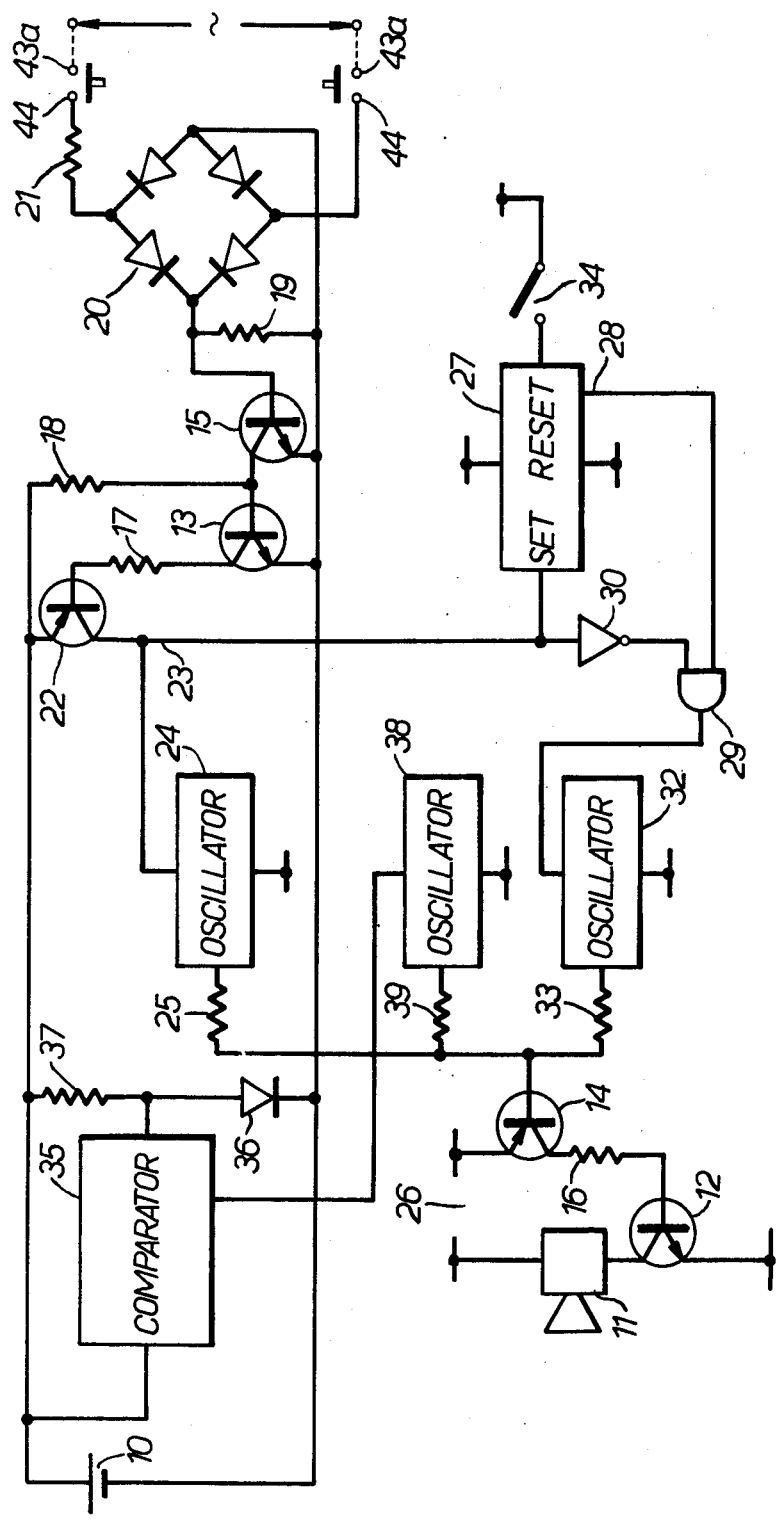
FIG. 5 shows a circuit diagram of a further embodiment of the invention.

FIG. 5 shows a circuit diagram based on that shown in FIG. 4 but which provides more information to a user than the simple continuously warning given by the circuit of FIG. 4. Like reference numerals will be used for like parts. As before, the mains supply is applied at springs 8 through a current limiting resistor 21 and a d.c. output is obtained from a bridge rectifier 20. The output of rectifier 20 is applied across a resistor 19 to the base of a transistor 15. In this condition only transistor 15 is turned on and this causes current to flow from the battery 10 through a resistor 18. The value of resistor 18 is high in order that extremely low currents of the order of $\mu A$ are taken from the battery 10. If no voltage is present at contacts 44 due to absence of mains supply, the transistor 15 is turned off and current through resistor 18 turns on the transistor 13, and hence a transistor 22 via the resistor 17. When the transistor 22 is turned on, a voltage substantially equal to the voltage of the battery 10, appears on line 23. This voltage operates means for modulating the alarm 11 which means is preferably an oscillator 24. An oscillator 24 which may be an astable multivibrator is connected to the collector of transistor 22 and is activated by the presence of the battery voltage on line 23 to generate pulses of long time constant through a resistor 25 to turn on transistor 14 periodically which activates alarm means 26 as previously described for FIG. 4. The oscillator 24 need not have an equal duty cycle and thus the sound generated by the alarm may consist of short audible periods alternating with longer silent periods. This contributes to extending the life of the battery 10 when the alarm is operating.

The above described circuit will produce a warning equivalent to that produced by the circuit of FIG. 4. However, were the mains supply of FIG. 4 to be restored, the warning would be cancelled and there would be no indication that the mains supply had been disconnected. The following part of the circuit provides such an indication.

A bistable latch 27 has its 'set' input connected to the line 23 so that a voltage on line 23 produces a logical 1 output from an output 28 of the latch. The output 28 is connected to one input of an AND gate 29 the other input of which is connected through an inverter 30 to the line 23. In the absence of mains supply, the AND gate has a logical 1 applied to it by the latch 27 and a logical 0 from the inverter 30. Thus, a logical 0 is present at its output. When the mains supply is restored and voltage reappears across the springs 8, the transistor 15 is turned on and the transistors 13 and 22 are turned off as described previously. Consequently line 23 is returned to zero potential. The inverter 30 produces a logical 1 output to AND gate 29, and in combination with the logical 1 output from bistable latch 27 which is still present, the AND gate 29 conducts to produce a logical 1 output. An oscillator 32, which may be an astable multivibrator, of similar type to oscillator 24, is activated by the output from the AND gate 31 and generates pulses through a resistor 33 to turn on transistor 14 periodically. Transistor 14 activates alarm means 26 as previously described. The oscillator 32 is arranged to provide a warning which is different to that provided by the oscillator 24. For example, the pulse times intervals generated by oscillator 32 may differ from those generated by oscillator 24 and thus produce alarm sounds of different pulse times to distinguish the state of mains absence condition from the state of mains failure and subsequent recovery. The alarm means when activated by oscillator 32, can be stopped by closing a reset switch 34 (which may be a switch biased to the open position) connected to the reset terminal of the latch 27. When reset switch 34 is closed, bistable latch 27 is reset which removes the logical 1 input to the AND gate 29. Thus AND gate 29 does not conduct and oscillator 32 stops generating pulses through resistor 33 to transistor 14 in alarm means 26, and the audible alarm is no longer activated.

The circuit shown in FIG. 5 is also provided with means for indicating low battery voltage. A comparator 35 which may comprise a long tail pair configuration of transistors, compares the voltage of the battery 10 with the voltage drop across a forward biased semiconductor diode 36 connected in series with a resistor 37 in a potential divider configuration. The characteristics of the semiconductor diode are such that the voltage across it is substantially constant over a wide range of operating current conditions. When the voltage of battery 10 drops, the comparator 35 produces an output to oscillator 38 which may be an astable multivibrator, of similar type to oscillator 24. Osciilator 38 is activated and generates pulses through resistor 33 to turn on transistor 14 periodically. Transistor 14 activates alarm means 26 as previously described. The warning provided by the oscillator 38 differs from that provided by the oscillators 24, 32; for example, the duty cycle or the oscillator frequency, or both, may differ. The circuit shown in FIG. 5 can be constructed using integrated circuit techniques in order that it occupy as little space as possible.

Figure 6:
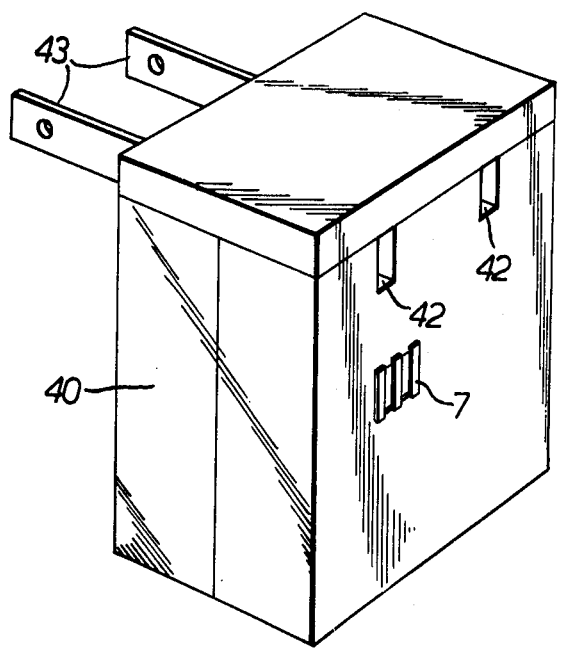
FIG. 6 shows a perspective view of yet another embodiment of the invention.
Figure 7:
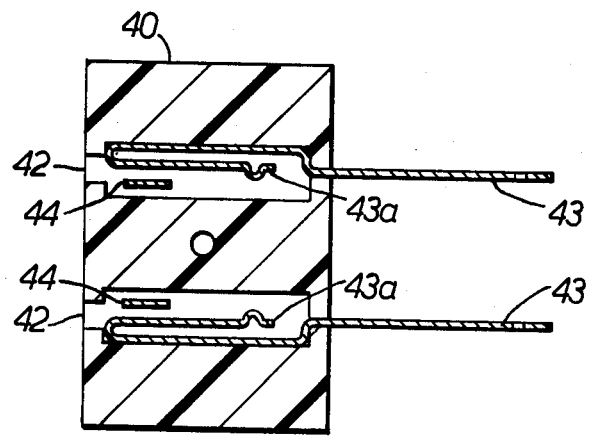
FIG. 7 shows a sectional plan view of the arrangement in FIG. 6.

In some circumstances it may be more convenient to utilize an adaptor provided with the mains absence warning rather than utilize a plug. This is particularly so in the U.S.A. where plugs are usually more compact than those used in the U.K. FIGS. 6 and 7 show an adaptor 40 whose configuration is suitable for this purpose.

The adaptor 40 comprises a body of insulating material provided with apertures 42 for receiving the pins of a mains plug. There may be two or three of these apertures depending on the type of plug. The adaptor 40 is also provided with pins 43 for insertion in a mains socket. Within the adaptor 40 are further contacts 44 which are connected to warning circuitry which may be shown in FIG. 4 or FIG. 5. Also, the pins 43 are provided with spring contact portions 43a whereby, when the pins of a mains plug are inserted into the apertures 42, they electrically connect the pins 43 to the contacts 44. This arrangement is shown in broken lines in FIG. 5. Thus, if either the mains plug is removed from the adaptor, or the adaptor is removed from the mains socket, or both, the warning will be given.

It will be appeciated that the number, disposition and shape of the pins used with the plug or adaptor may be altered to suit local regulations.

What we claim is:

1. Apparatus for connecting the conductors of an electrical device with the lines of a power supply system, respectively, comprising
    (a) connector means including a housing, input terminals mounted on said housing for connection with conductors of the electrical device, respectively, and output terminals mounted on said housing for connection with the power supply lines, respectively;

(b) normally de-activated audible indicating means mounted on said housing, said indicating means including
   (1) a battery (10);
   (2) an audible alarm (11); and
   (3) semi-conductor switch means (12) operable to connect said battery with said alarm; and
(c) detector means responsive to the de-energization of said power supply lines for activating said audible alarm, said detector means comprising means including a direct-current rectifier circuit (20) mounted on said housing and connected across one pair of said terminals for rendering said switch means non-conductive when said power supply lines are energized.

2. Apparatus as defined in claim 1, wherein said indicating means includes at least one modulating means for operating said audible indicating means to produce pulses of sound.

3. Apparatus as defined in claim 2, wherein a plurality of normally de-activated different modulating means are provided for operating said audible alarm means to produce distinguishably different pulses of sound, and selecting means for selectively operating one of said modulating means.

4. Apparatus as defined in claim 3, and further including reset means for activating a second one of said modulating means (32) upon the subsequent recovery of power to the de-energized power supply lines, said activating means including
   (1) means including an AND gate (29) having an output connected with said second modulating means, and a pair of input terminals, an inverter (30) connecting one AND gate input terminal with said rectifier means, a bistable latch (27) having an output connected with the other AND gate input, a set input connected with the input to the inverter, and a reset input; and
   (2) manually operable reset switch means (34) for resetting the latch means to de-activate said second modulator means.

5. Apparatus as defined in claim 3, and further including means including a voltage comparator (35) for activating a second one of said modulating means (38) when the battery voltage decreases below a given value.

6. Apparatus as defined in claim 1, wherein the detecting means and the indicating means are mounted on a printed circuit board.

7. A device according to claim 6, wherein the printed circuit board is provided with input contacts which are connected to the connecting terminals by spring connections.

8. Apparatus as defined in claim 7, wherein the device is a plug and the connecting means comprise pins arranged to be received in sockets in a mains outlet.

9. A device according to claim 8, wherein the plug comprises a base member provided with the pins an outer housing, and a further member provided with the detecting and indicating means, the further member being sandwiched between the base member and the outer housing.

10. Apparatus as defined in claim 1, wherein the device is an adaptor and the connecting means comprise pins arranged to be received in sockets in a mains outlet.

11. A device according to claim 10, wherein the connecting means comprises contacts responsive to the presence of a plug for connecting the detecting means to the pins.

12. A device according to claim 11, wherein the contacts and the pins are disposed within the adaptor in spaced apart relation so that pins of a plug when inserted bridge the space between the contacts and the pins.

* * * * *